United States Patent
Kudo (10) Patent No.: US 9,614,115 B2
(45) Date of Patent: Apr. 4, 2017

(54) SEMICONDUCTOR DEVICE AND METHOD FOR MANUFACTURING THE SAME

(71) Applicant: SEIKO EPSON CORPORATION, Tokyo (JP)

(72) Inventor: Manabu Kudo, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 51 days.

(21) Appl. No.: 14/503,727

(22) Filed: Oct. 1, 2014

(65) Prior Publication Data

US 2015/0102449 A1  Apr. 16, 2015

(30) Foreign Application Priority Data

Oct. 16, 2013  (JP) ................. 2013-215737

(51) Int. Cl.
| | | |
|---|---|---|
| H01L 31/105 | (2006.01) | |
| H01L 31/0352 | (2006.01) | |
| H01L 31/0224 | (2006.01) | |
| H01L 27/144 | (2006.01) | |
| H01L 27/146 | (2006.01) | |
| G06K 9/00 | (2006.01) | |
| G06K 9/20 | (2006.01) | |

(52) U.S. Cl.
CPC ...... *H01L 31/1055* (2013.01); *H01L 27/1446* (2013.01); *H01L 27/14609* (2013.01); *H01L 27/14692* (2013.01); *H01L 31/022408* (2013.01); *H01L 31/035281* (2013.01); *G06K 9/0004* (2013.01); *G06K 9/2018* (2013.01); *Y02E 10/50* (2013.01)

(58) Field of Classification Search
CPC ............. H01L 31/105; H01L 31/1055; H01L 31/0352; H01L 31/035281; H01L 31/03529

USPC .................................. 257/458, 465
See application file for complete search history.

(56) References Cited

U.S. PATENT DOCUMENTS

| | | | |
|---|---|---|---|
| 7,393,724 B2 * | 7/2008 | Abe ................. | H01L 29/42384 257/E21.413 |
| 7,772,667 B2 * | 8/2010 | Sugawara ....... | H01L 31/022408 257/438 |
| 8,680,641 B2 * | 3/2014 | Prineas ............... | H01L 27/1446 257/443 |

(Continued)

FOREIGN PATENT DOCUMENTS

| | | | |
|---|---|---|---|
| JP | 2011-077184 A | 4/2011 | |
| KR | 20150044396 A * | 4/2015 | ......... H01L 31/1055 |

*Primary Examiner* — Earl Taylor
(74) *Attorney, Agent, or Firm* — Global IP Counselors, LLP (57) ABSTRACT

Provided is a semiconductor device that can suppress a leakage current more than has been achieved before. A semiconductor device 22 includes a first carrier holding layer 48, which is arranged on a lower electrode 47, is in contact with a lower electrode 47 via a first interface 49, and includes majority carriers of one type, and a second carrier holding layer 57, which is arranged on the first carrier holding layer 48, defines a second interface 58 constituting a conduction path to the first carrier holding layer 48, and includes majority carriers of the other type. The first interface 49 has its outline within the outline of the first carrier holding layer 48 when seen in a plan view in a direction that is orthogonal to a surface of the substrate, and the second interface 58 has its outline within the outline of the first carrier holding layer 48 when seen in the plan view.

9 Claims, 10 Drawing Sheets

(56) References Cited

U.S. PATENT DOCUMENTS

| | | | |
|---|---|---|---|
| 8,952,477 B2* | 2/2015 | Yamada | H01L 27/14663 257/458 |
| 2006/0017053 A1* | 1/2006 | Abe | H01L 29/42384 257/66 |
| 2006/0260675 A1* | 11/2006 | Sugawara | H01L 31/022408 136/252 |
| 2009/0278121 A1* | 11/2009 | Kakkad | G02F 1/13318 257/43 |
| 2011/0073979 A1* | 3/2011 | Okada | H01L 31/035281 257/458 |
| 2011/0260278 A1* | 10/2011 | Prineas | H01L 27/1446 257/443 |
| 2012/0038018 A1* | 2/2012 | Yamada | H01L 27/14663 257/458 |
| 2013/0149809 A1* | 6/2013 | Yamada | H01L 27/14663 438/87 |
| 2015/0102449 A1* | 4/2015 | Kudo | H01L 31/1055 257/459 |

* cited by examiner

SEMICONDUCTOR DEVICE AND METHOD FOR MANUFACTURING THE SAME

This application claims the benefit of Japanese Patent Application No. 2013-215737, filed on Oct. 16, 2013. The content of the aforementioned application is incorporated herein by reference in its entirety.

BACKGROUND

1. Technical Field

The present invention relates to a semiconductor device and a method for manufacturing the same, and a photoelectric conversion device, an electronic device, and the like that use the semiconductor device.

2. Related Art

Semiconductor devices such as PIN-type photodiodes are generally known. In the PIN-type photodiode, a semiconductor layer is formed on a lower electrode. The semiconductor layer includes, for example, an $n^+$ layer, an i layer, and a $p^+$ layer (all of which are amorphous silicon layers) that are stacked in order from the lower electrode side. The n+ layer is directly formed on the lower electrode. The i layer overlaps the $n^+$ layer. On the $p^+$ layer, an upper electrode is formed. The $p^+$ layer and the upper electrode have their outlines within the outline of the semiconductor layer. When the semiconductor layer is irradiated with light, an electric charge is generated. The $p^+$ layer on the upper side is made small during processing, which suppresses' a leakage current. It is known that, even if an interface between the upper electrode and the $p^+$ layer is made small, the leakage current is not sufficiently suppressed when the $p^+$ layer extends over the entire surface of the i layer.

JP A-2011-77184 is an example of related art.

Images are expected to be captured in higher resolution in the future. Higher resolution requires downsizing of a photodiode. In the photodiode, a downsized semiconductor layer increases the influence of a leakage current. Further suppression of the leakage current is desired.

SUMMARY

According to at least one aspect of the invention, it is possible to provide a semiconductor device that can suppress a leakage current more than has been achieved before.

1. According to an aspect of the invention, a semiconductor device includes: a lower electrode that is arranged on a substrate; a first carrier holding layer that is arranged on the lower electrode, is in contact with the lower electrode via a first interface, and includes majority carriers of one type; and a second carrier holding layer that is arranged on the first carrier holding layer, defines a second interface constituting a conduction path to the first carrier holding layer, and includes majority carriers of the other type. The first interface has an outline thereof within an outline of the first carrier holding layer when seen in a plan view in a direction that is orthogonal to the surface of the substrate, and the second interface has an outline thereof within the outline of the first carrier holding layer when seen in the plan view.

Between the lower electrode and the second carrier holding layer, an electric field increases between the first interface and the second interface. On the other hand, the electric field decreases along the end face of the first carrier holding layer. As a result, a leakage current can be suppressed along the end face of the first carrier holding layer.

2. It is preferable that a distance a between an end of the first interface and an end of the first carrier holding layer, and a distance b between an end of the second interface and the end of the first carrier holding layer have a relationship of b>a. According to the working example of the inventors, when this relationship is satisfied between the distances a and b, a leakage current will reliably be reduced.

3. It is preferable that a difference between the distance b and the distance a be greater than 1 µm and less than 3 µm. When the difference (b−a) between the distance b and the distance a is greater than 1 µm, a leakage current will reliably be reduced. On the other hand, when the difference (b−a) between the distance b and the distance a is 3 µm or more, this means that the second interface is too small relative to the first interface and an actual current path is too narrow, and thus the first carrier holding layer and the second carrier holding layer cannot sufficiently function.

4. It is preferable that the semiconductor device further include an insulating film that overlaps a part of the lower electrode that is outside the first interface along the outline of the first interface, and supports, on the lower electrode, a part of the first carrier holding layer. When the semiconductor device is manufactured, the insulating film is formed on the lower electrode. Although the insulating film overlaps the region of the surface of the lower electrode other than a target region for the first interface, the target region for the first interface remains exposed. The first carrier holding layer is formed on the lower electrode and the insulating film. The insulating film limits the first carrier holding layer on the lower electrode. Accordingly, the first interface is formed between the first carrier holding layer and the lower electrode, as required.

5. It is preferable that the insulating film have a thickness of 300 nm or more, measured from the surface of the lower electrode. When such a thickness of the insulating film is set, the insulating film between the lower electrode and the first carrier holding layer can reliably realize insulation. Accordingly, the first interface can be defined reliably.

6. It is preferable that the first carrier holding layer have a length of from 5 µm or more to 20 µm or less, measured along the surface of the lower electrode. Accordingly, the semiconductor device can have a sufficient sensitivity.

7. It is preferable that the second interface be defined between the first carrier holding layer and the second carrier holding layer. Carrier movement is realized between the first carrier holding layer and the second carrier holding layer. In contrast with a PIN structure semiconductor device, a semiconductor layer may be omitted.

8. It is preferable that the semiconductor device further include a semiconductor layer that is formed on the first carrier holding layer, and is in contact with the second carrier holding layer via the second interface. The semiconductor layer functions as a source for supplying carriers to the first carrier holding layer and the second carrier holding layer. Accordingly, the semiconductor layer can improve the sensitivity of carrier movement. A so-called PIN structure semiconductor device can be formed.

9. According to another aspect of the invention, the semiconductor device may be used by being incorporated into a photoelectric conversion device. Here, the photoelectric conversion device only needs to include the semiconductor device.

10. According to a further aspect of the invention, the semiconductor device may be used by being incorporated into an electronic device. Here, the electronic device only needs to include the semiconductor device. A biometric authentication device is an example of the electronic device.

11. According to a still further aspect of the invention, a method for manufacturing a semiconductor device includes:

forming a lower electrode on a substrate; forming a first carrier holding layer on the lower electrode, the first carrier holding layer including majority carriers of one type and having an outline that is on the outside of an outline of a first interface with the lower electrode, when seen in a plan view in a direction that is orthogonal to a surface of the substrate; and forming a second carrier holding layer on the first carrier holding layer, the second carrier holding layer including majority carriers of the other type and defining a second interface that constitutes a conduction path to the first carrier holding layer and whose outline is within the outline of the first carrier holding layer.

Between the lower electrode and the second carrier holding layer of the thus manufactured semiconductor device, an electric field increases between the first interface and the second interface. On the other hand, the electric field decreases along the end face of the first carrier holding layer. As a result, a leakage current can be suppressed along the end face of the first carrier holding layer.

12. It is preferable that the method for manufacturing a semiconductor device further include: overlaying, when forming the first carrier holding layer, an insulating film on the lower electrode while exposing a target region for the first interface; stacking a raw material film of the first carrier holding layer on the lower electrode and the insulating film; and patterning the raw material film in a predetermined pattern to form the first carrier holding layer. The insulating film limits the first carrier holding layer on the lower electrode. Accordingly, the first interface is formed between the first carrier holding layer and the lower electrode, as required.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments of the invention will be described with reference to the accompanying drawings. Note that the following embodiments do not unduly restrict the contents of the inventions described in Claims, and all the configurations described in the present embodiments are not necessarily essential for means for solving the problems addressed by the invention.

1. Configuration of Photoelectric Conversion Device

Figure 1:
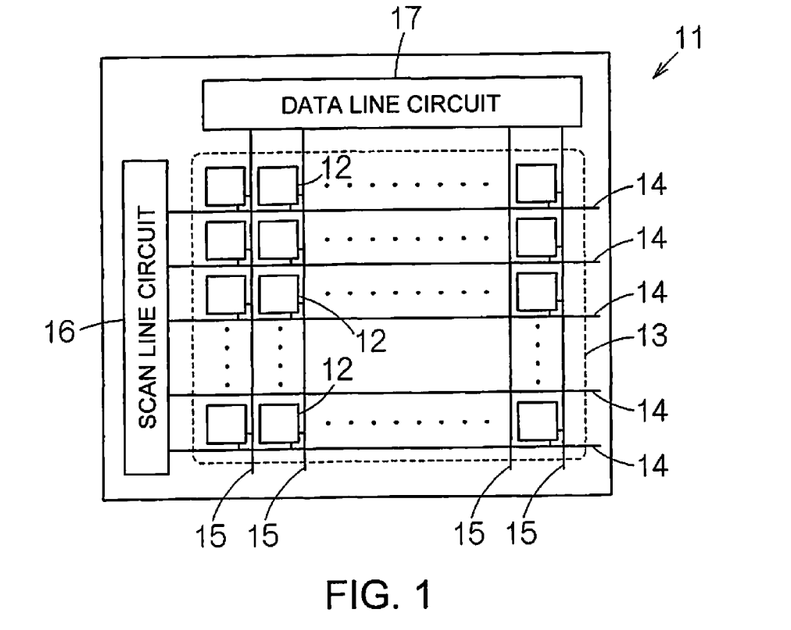
FIG. 1 is a connection diagram schematically showing an electrical configuration of a photoelectric conversion device according to an embodiment.

FIG. 1 schematically shows an electrical configuration of a photoelectric conversion device 11 according to an embodiment of the invention. The photoelectric conversion device 11 includes a plurality of photodetection elements 12. The photodetection elements 12 are arranged, for example, in an array to form a device array (element region) 13. Here, the photodetection elements 12 are arranged according to a matrix pattern of multiple rows and multiple columns.

The photoelectric conversion device 11 includes a plurality of scan lines 14 and a plurality of data lines 15. The scan lines 14 extend parallel to each other in the row direction. One scan line 14 is assigned to one row of photodetection elements 12. The scan line 14 is connected to all of one row of photodetection elements 12. All the scan lines 14 are connected to a scan line circuit 16. The scan line circuit 16 ensures conduction of the scan lines 14 in order according to a time axis. The data lines 15 extend parallel to each other in the column direction. One data line 15 is assigned to one column of photodetection elements 12. The data line 15 is connected to all of one column of photodetection elements 12. All the data lines 15 are connected to a data line circuit 17. The data line circuit 17 ensures conduction of the data lines 15 in order according to a time axis. Accordingly, an electric charge of each photodetection element 12 that depends on irradiated light is detected. Each photodetection element 12 corresponds to one pixel.

Figure 2:
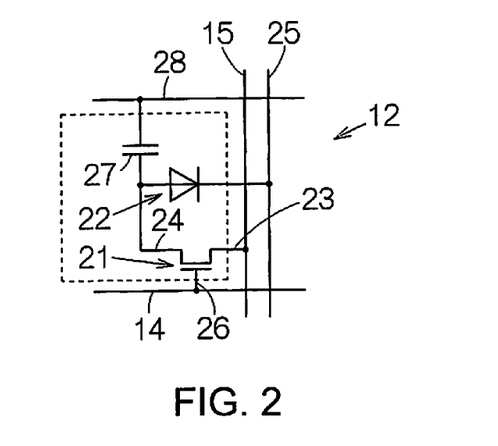
FIG. 2 is an equivalent circuit diagram showing a photodetection element.

As shown in FIG. 2, each photodetection element 12 includes a thin-film transistor (TFT) 21 serving as a switching element, and a photodiode 22 serving as a photoelectric conversion element. A source electrode 23 of the TFT 21 is connected to a data line 15. One electrode of the photodiode 22 is connected to a drain electrode 24 of the TFT 21. The other electrode of the photodiode 22 is connected to a constant potential line 25 that is arranged parallel to the data line 15. A scan line 14 is connected to a gate electrode 26 of the TFT 21. When a voltage is applied to the gate electrode 26 from the scan line 14, conduction between the source electrode 23 and the drain electrode 24 is ensured. The photodiode 22 is configured as a PIN diode, as will be described later. The photodiode 22 is a specific example of the semiconductor device that realizes photoelectric conversion.

The photodetection element 12 includes a retention capacitor 27. One electrode of the retention capacitor 27 is connected to the drain electrode 24 of the TFT 21, and the other electrode of the retention capacitor 27 is connected to a constant potential line 28 that is arranged parallel to the scan line 14.

2. Configuration of Photodetection Element According to First Embodiment

Figure 3:
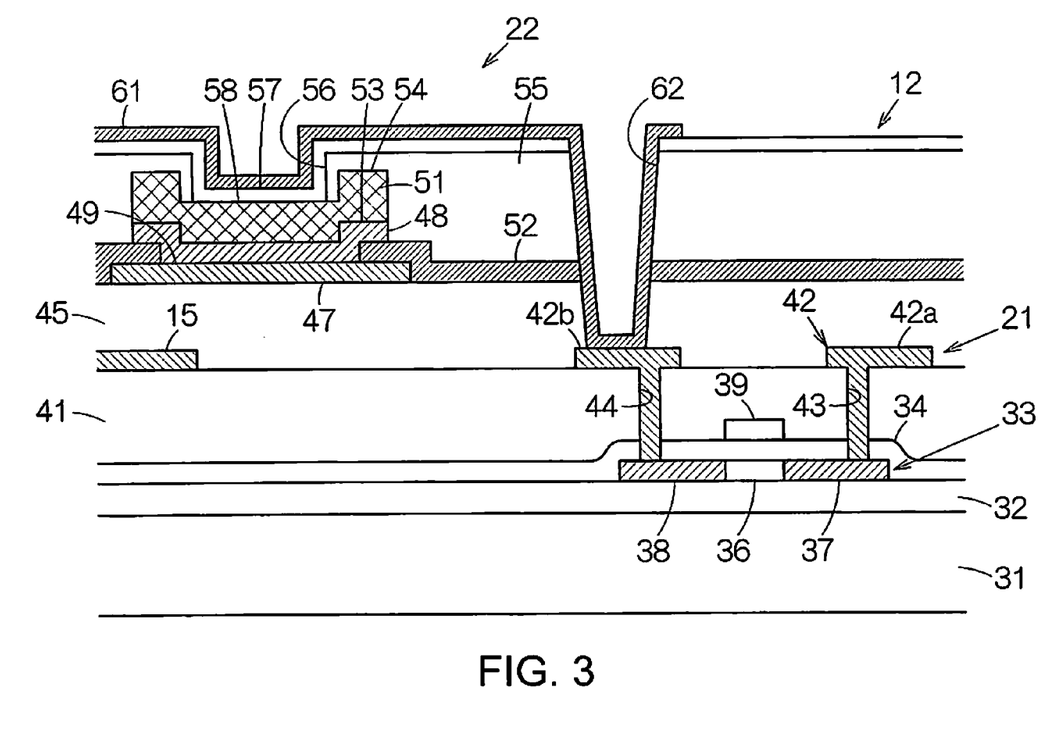
FIG. 3 is a vertical cross-sectional view schematically showing a configuration of a photodetection element according to a first embodiment.

As shown in FIG. 3, a photoelectric conversion device 11 includes a substrate 31. The substrate 31 may be, for example, a transparent glass substrate or an opaque silicon substrate. A base insulating film 32 is stacked on the surface of the substrate 31. The base insulating film 32 covers the entire surface of the substrate 31. The base insulating film 32 may be constituted by, for example, a silicon dioxide film ($SiO_2$). For each photodetection element 12, a semiconductor film 33, which is made from polycrystalline silicon, is formed on the substrate 31 in the shape of an island. The semiconductor film 33 has a thickness of about 50 nm, for example. The semiconductor film 33 is covered with an insulating layer 34. The insulating layer 34 extends over the entire surface of the base insulating film 32. The insulating layer 34 constitutes a gate insulating film on the semiconductor film 33. The insulating layer 34 is made from an insulating material such as, for example, $SiO_2$. The insulating layer 34 has a thickness of about 100 nm.

The semiconductor film 33 is divided at a channel formation region 36 into a source region 37 and a drain region 38. A gate electrode 39 is formed at a position on the insulating layer 34 that is opposite to the channel formation region 36. The gate electrode 39 is made from a metal material such as, for example, molybdenum (Mo). The gate electrode 39 has a thickness of about 500 nm. A first interlayer insulating film 41 is stacked on the insulating layer 34. The first interlayer insulating film 41 covers the gate electrode 39. The first interlayer insulating film 41 is made from an insulating material such as, for example, a silicon dioxide film. The first interlayer insulating film 41 has a thickness of about 800 nm.

A conducting film pattern 42 is formed on the first interlayer insulating film 41. The conducting film pattern 42 includes a source electrode 42a and a drain electrode 42b for each photodetection element 12. The conducting film pattern 42 is made from a metal material such as Mo. The conducting film pattern 42 has a thickness of about 500 nm. A conducting material of the source electrode 42a fills up a contact hole 43 that penetrates the first interlayer insulating film 41 and the insulating layer 34. Accordingly, the source electrode 42a is connected to the source region 37 of the semiconductor film 33. Similarly, a conducting material of the drain electrode 42b fills up a contact hole 44 that penetrates the first interlayer insulating film 41 and the insulating layer 34. Accordingly, the drain electrode 42b is connected to the drain region 38 of the semiconductor film 33. The conducting film pattern 42 includes a data line 15 that is connected to the source electrode 42a.

A second interlayer insulating film 45 is stacked on the first interlayer insulating film 41. The second interlayer insulating film 45 is constituted by a stack of, for example, a planarized film and a passivation film. The planarized film may be, for example, an insulating film such as an acrylic resin film having a thickness of about 3 μm, and the passivation film may be made from, for example, an insulating material such as a silicon nitride film ($Si_3N_4$) having a thickness of about 200 nm. The second interlayer insulating film 45 covers the source electrode 42a, the drain electrode 42b, and the data line 15.

A photodiode 22 is arranged on the second interlayer insulating film 45. The photodiode 22 includes a lower electrode 47. The lower electrode 47 is formed on the second interlayer insulating film 45. The lower electrode 47 is formed in a predetermined pattern when seen in a plan view in a direction that is orthogonal to a surface of the second interlayer insulating film 45 (hereinafter, referred to simply as "when seen in the plan view"). The lower electrode 47 may be made from a conducting material such as Al (aluminum), Mo (molybdenum), or the like.

A lower contact layer (first carrier holding layer) 48 is arranged on the lower electrode 47. The lower contact layer 48 covers the surface (upper surface) of the lower electrode 47 and is in contact with the lower electrode 47 via a first interface 49. The lower contact layer 48 is made from, for example, amorphous silicon. The lower contact layer 48 may have a thickness of 10 nm to 200 nm. Here, the lower contact layer 48 serves as an $n^+$ layer. The lower contact layer 48 includes electrons serving as majority carriers. However, the lower contact layer 48 may also be a $p^+$ layer, instead of the $n^+$ layer. The $p^+$ layer includes holes serving as majority carriers.

A semiconductor layer (i layer) 51 is formed on the lower contact layer 48. The semiconductor layer 51 is defined so as to have an outline having a predetermined shape when seen in the plan view. Here, the outline of the semiconductor layer 51 is circular. The outline of the semiconductor layer 51 is aligned with the outline of the lower contact layer 48. The semiconductor layer 51 is made from, for example, microcrystal silicon. Accordingly, the end faces of the semiconductor layer 51 and the lower contact layer 48 are continuous and coplanar along the interface between the semiconductor layer 51 and the lower contact layer 48. The semiconductor layer 51 may have a thickness of 400 nm to 1200 nm.

An insulating film 52 is arranged on a part of the lower electrode 47 that is outside the first interface 49 along the outline of the first interface 49. The insulating film 52 overlaps the lower electrode 47 inward from the peripheral outline of the lower electrode 47. The insulating film 52 defines a space within the outline of the lower electrode 47 on the lower electrode 47. The lower contact layer 48 is arranged in this space. Accordingly, the insulating film 52 limits the first interface 49 on the surface of the lower electrode 47. The first interface 49 has its outline within the outline of the lower contact layer 48 when seen in the plan view. The insulating film 52 may be constituted by, for example, a silicon nitride film or a silicon dioxide film. The insulating film 52 may have a thickness of about 300 nm to 1000 nm.

The part of the lower contact layer 48 that is outside the first interface 49 sits on the insulating film 52 on the lower electrode 47. Accordingly, the lower contact layer 48 has a step-like surface 53. Since the semiconductor layer 51 having a uniform thickness is formed on the lower contact layer 48 having the step-like surface 53, the surface of the semiconductor layer 51 is reflected by the step-like surface 53. Similarly, the semiconductor layer 51 has a step-like surface 54.

A third interlayer insulating film 55 is stacked on the second interlayer insulating film 45. The third interlayer insulating film 55 covers the lower contact layer 48 and the semiconductor layer 51. The third interlayer insulating film 55 is made from, for example, an insulating material such as a silicon dioxide film or a silicon nitride film. The third interlayer insulating film 55 may have a thickness of, for example, 300 nm to 1000 nm. The third interlayer insulating film 55 has an opening 56 on the semiconductor layer 51. The opening 56 is recessed inside the step-like surface 54, and defines a space that is adjacent to the flat surface of the semiconductor layer 51.

An upper contact layer (second carrier holding layer) 57 is stacked on the third interlayer insulating film 55. The upper contact layer 57 is made from, for example, amorphous silicon. The upper contact layer 57 may have a thickness of 10 nm to 200 nm. The upper contact layer 57 extends into the opening 56. The upper contact layer 57 is stacked on the surface of the semiconductor layer 51 in the opening 56. Accordingly, the upper contact layer 57 defines a second interface 58 with the semiconductor layer 51. Between the second interface 58 and the first interface 49, a current conduction path is formed between the semiconductor layer 51 and the lower contact layer 48. The second interface 58 has its outline within the outlines of the semiconductor layer 51 and the lower contact layer 48 when seen in the plan view. Here, the upper contact layer 57 constitutes a $p^+$ layer. However, the upper contact layer 57 may be an $n^+$ layer when the lower contact layer 48 is a $p^+$ layer.

The upper electrode 61 is formed on the upper contact layer 57. The upper electrode 61 is formed in a predetermined pattern when seen in the plan view. The upper electrode 61 may be made from a transparent conducting material such as ITO (tin-doped indium oxide) or the like. The upper electrode 61 may have a thickness of about 10 nm to 200 nm. The upper electrode 61 overlaps the upper contact layer 57 in the opening 56. A contact hole 62 that reaches the drain electrode 42b is formed in the third interlayer insulating film 55 and the second interlayer insulating film 45. The upper electrode 61 extends into the contact hole 62. Accordingly, the upper electrode 61 is connected to the drain electrode 42b.

Figure 4:
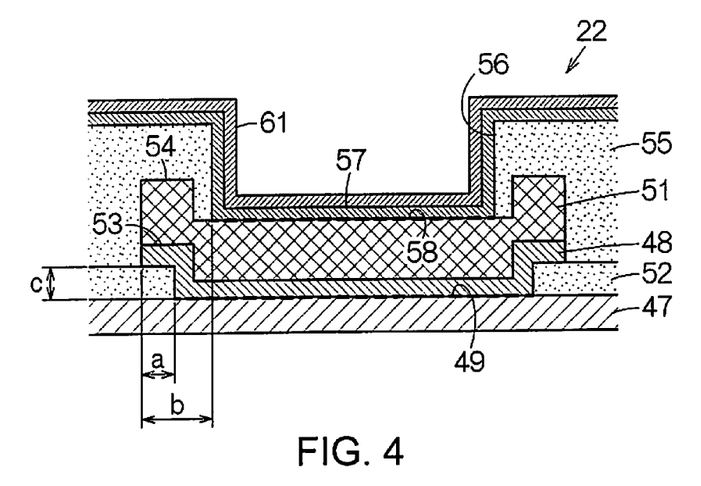
FIG. 4 is an enlarged vertical cross-sectional view schematically showing a configuration of a photodiode.

As shown in FIG. 4, in the photodiode 22, a distance a between the end of the first interface 49, and the end faces of the lower contact layer 48 and the semiconductor layer 51, and a distance b between the end of the second interface 58, and the end faces of the lower contact layer 48 and the semiconductor layer 51 have the relationship of b>a. In this case, a difference (b−a) between the distance b and the distance a is greater than 1 μm and less than 3 μm. Furthermore, the thickness c of the insulating film 52 that is measured from the surface of the lower electrode 47 is 300 nm or more. The lower contact layer 48 and the semiconductor layer 51 have the length of from 5 μm or more to 20 μm or less, measured along the surface of the lower electrode 47.

In the photoelectric conversion device 11, the photodiode 22 is irradiated with light while a reverse bias voltage is applied to the photodiode 22 from the constant potential lines 25 and 28. Accordingly, a photo-electric current flows through a p-n junction between the upper contact layer 57, serving as a $p^+$ layer, and the lower contact layer 48, serving as an $n^+$ layer, and a corresponding electric charge is accumulated in the retention capacitor 27. The corresponding TFT 21 is selected by each of the plurality of scan lines 14, and a signal that corresponds to the electric charge accumulated in the retention capacitor 27 of each photodetection element 12 is sequentially output to the corresponding data line 15. Accordingly, the intensity of light received by each photodetection element 12 can be detected.

In each photodetection element 12, the first interface 49 has its outline within the outlines of the lower contact layer 48 and the semiconductor layer 51 when seen in the plan view, and at the same time, the second interface 58 has its outline within the outlines of the lower contact layer 48 and the semiconductor layer 51 when seen in the plan view. Accordingly, the first interface 49 and the second interface 58 are smaller than the horizontal cross sections of the lower contact layer 48 and the semiconductor layer 51. As a result, current conduction paths of the lower contact layer 48 and the semiconductor layer 51 are narrowed. Between the lower electrode 47 and the upper contact layer 57, an electric field increases between the first interface 49 and the second interface 58. On the other hand, the electric field decreases along the end faces of the lower contact layer 48 and the semiconductor layer 51. As a result, it is possible to suppress a leakage current along the end faces of the lower contact layer 48 and the semiconductor layer 51.

According to the working example of the inventors, as will be described later, when, in the photodiode 22, the distance a between the end of the first interface 49 and the end faces of the lower contact layer 48 and the semiconductor layer 51, and the distance b between the end of the second interface 58 and the end faces of the lower contact layer 48 and the semiconductor layer 51 have the relationship of b>a, a leakage current decreases. As described above, the lower contact layer 48 and the semiconductor layer 51 sit on the insulating film 52. The lower contact layer 48 and the semiconductor layer 51 have respectively the step-like surfaces 53 and 54. In the steps, uneven film deposition is likely to occur and form a path for a leakage current. Therefore, when the relationship of b>a is satisfied, the upper contact layer 57 can be located in a remote place from the steps.

Specifically, when a difference (b−a) between the distance b and the distance a is greater than 1 μm, a leakage current reliably decreases. On the other hand, the difference (b−a) between the distance b and the distance a is 3 μm or more, this means that the second interface 58 is too small relative to the first interface 49 and an actual current path is too narrow, and thus the lower contact layer 48 and the upper contact layer 57 cannot sufficiently function. In addition, since the thickness of the lower contact layer 48 on the lower electrode 47 is 300 nm or more, the insulating film 52 between the lower electrode 47 and the lower contact layer 48 can reliably realize insulation. Thus, a current conduction path at the first interface 49 can reliably be narrowed.

The lower contact layer 48 has a length of from 5 μm or more to 20 μm or less, measured along the surface of the lower electrode 47. That is, the first interface 49 has the length of from 5 μm or more to 20 μm or less. If the length of the first interface 49 exceeds 20 μm, the lower contact layer 48 can sufficiently contribute to suppression of a leakage current even when it is directly formed on the lower electrode 47 without the insulating film 52 therebetween. If the length of the first interface 49 is less than 5 μm, the photodiode 22 cannot receive a sufficient amount of light. This reduces the sensitivity.

The semiconductor layer 51 functions as a source for supplying carriers to the lower contact layer 48 and the upper contact layer 57. Accordingly, the semiconductor layer 51 can improve the sensitivity of carrier movement. The so-called PIN structure photodiode 22 can be formed.

3. Working Example

Figure 5:
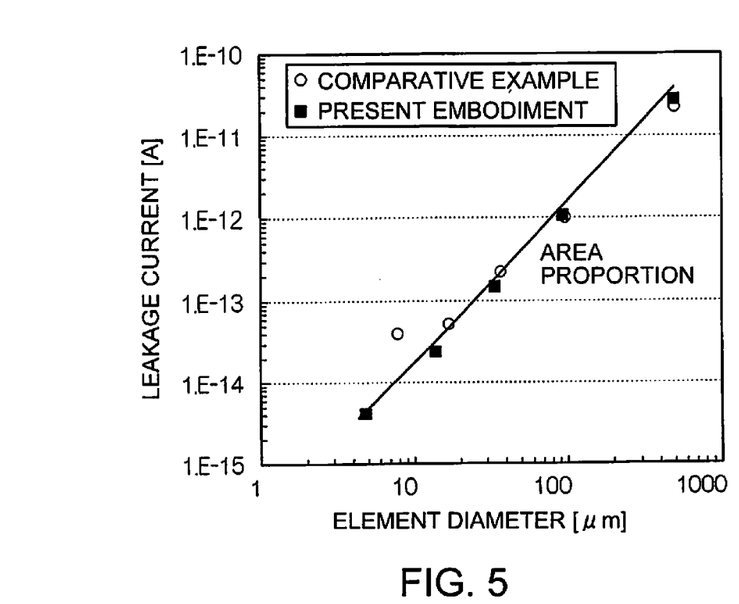
FIG. 5 is a graph showing the correlative relationship of an element diameter to a dark current.
Figure 6:
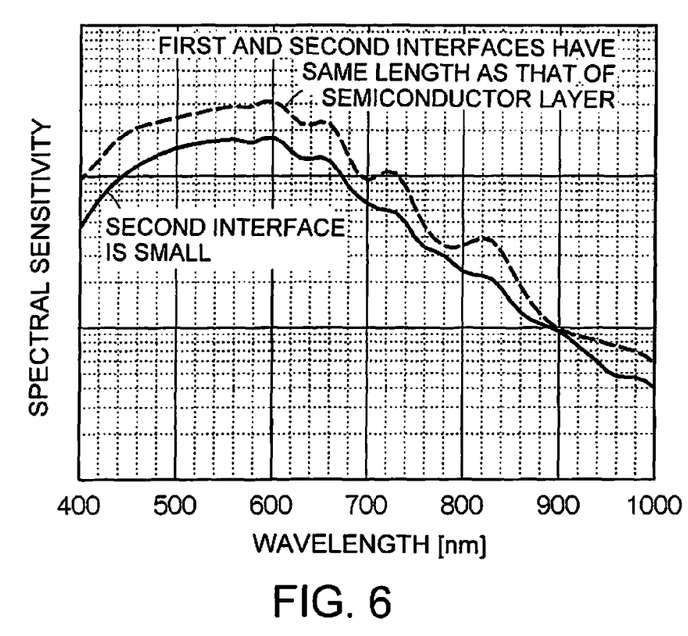
FIG. 6 is a graph showing spectral sensitivity characteristics.

The inventors examined the correlative relationship of the size of the photodiode 22 to a dark current (leakage current). Here, the semiconductor layer 51 was formed in the shape of a circle when seen in the plan view. The semiconductor layer 51 has the thickness of 700 nm. The element diameter is from 10 μm to 500 μm. A reverse bias voltage of 5 V was applied to the photodiode 22. The inventors examined a comparative example at the same time. In the comparative example, the lower contact layer is formed directly on the lower electrode 47. Accordingly, the first interface 49 between the lower electrode 47 and the lower contact layer 48 is defined so as to be aligned with the outline of the semiconductor layer 51. In the comparative example, similarly to the case of the photodiode 22 according to the present embodiment, the second interface 58 between the upper contact layer 57 and the semiconductor layer 51 is small and located within the outline of the semiconductor layer 51. As shown in FIG. 5, it was confirmed that when the photodiode 22 according to the present embodiment has the element diameter of from 5.0 μm or more to 20.0 μm or less, a dark current is suppressed as compared with that of the comparative example. It was found that an influence of edge leakage is suppressed in the photodiode 22 according to the present embodiment as compared with the comparative example. Note that, since when the second interface 58 is small, a photoelectric conversion region cannot be determined by the diameter of the semiconductor layer 51, the element diameter was obtained so as to have the same sensitivity in the spectral sensitivity characteristics shown in FIG. 6. In the working example, the element diameter has the value that is 2.8 μm greater than the diameter of the upper contact layer. In FIG. 6, a solid line denotes the spectral sensitivity of the photodiode in which the second interface 58 is small, and a dashed line denotes the spectral sensitivity of the photodiode in which the sizes of the first interface 49 and the second interface 58 are the same as that of the semiconductor layer 51.

Figure 7:
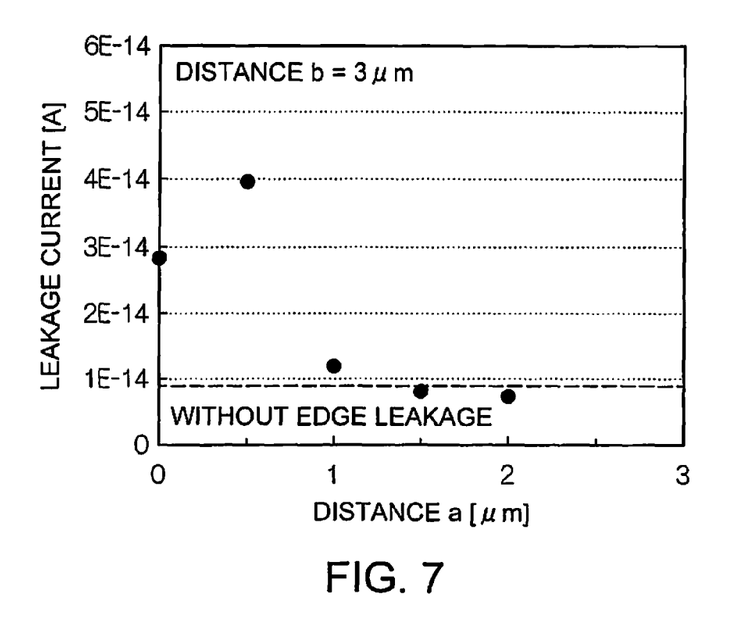
FIG. 7 is a graph showing the correlative relationship of a distance a between the end of a first interface and the end face of a lower contact layer, to a dark current.

Then, the inventors measured a dark current in the photodiode 22 while varying the distance a between the end of the first interface 49 and the end faces of the lower contact layer 48 and the semiconductor layer 51. As a result, it was confirmed, as shown in FIG. 7, that a dark current is suppressed when the distance a is 1.0 μm or more. Note that, in the working example, the distance b between the end of the second interface 58 and the end faces of the lower contact layer 48 and the semiconductor layer 51 is fixed at 3 μm.

Figure 8:
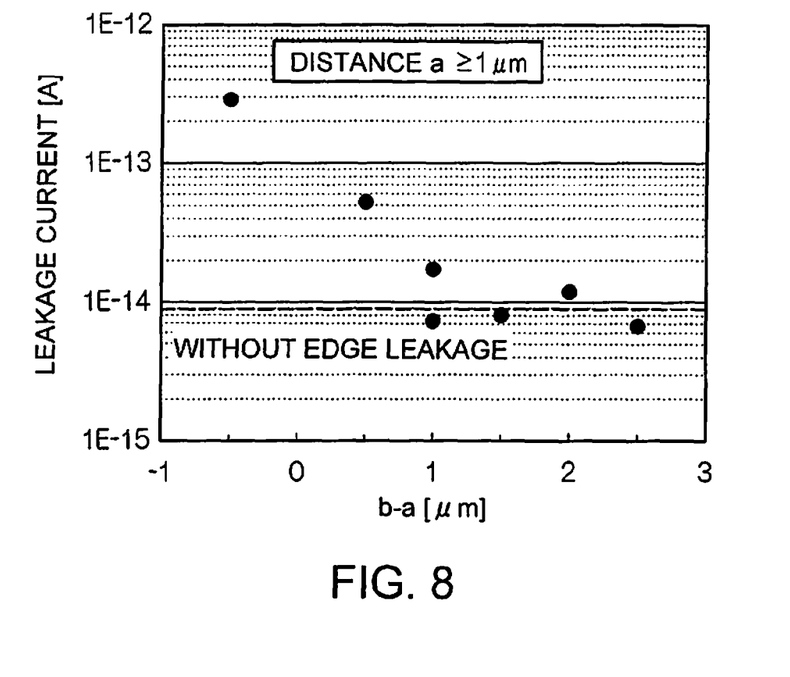
FIG. 8 is a graph showing the correlative relationship of a difference (b−a) between the distance a and a distance b, to a dark current.

Then, the inventors examined the correlative relationship of a difference (b−a) between the distance a and the distance b, to a dark current with respect to the photodiode 22. As a result, as shown in FIG. 8, when the difference (b−a) exceeded 1 μm, a dark current decreased. Here, the distance a is maintained at 1.0 μm or more in every measurement.

Figure 9:
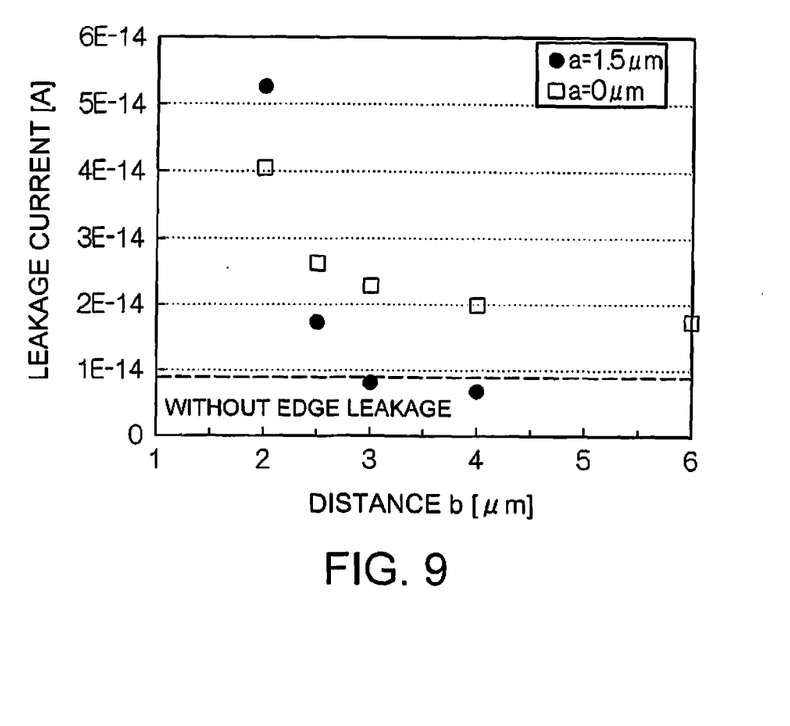
FIG. 9 is a graph showing effects of reduction in the area of the first interface.

Then, the inventors examined the effect of reduction in the area of the first interface 49. The inventors measured a dark current while maintaining the distance a at 1.5 μm and varying the distance b. The inventors measured a dark current in the comparative example. In the comparative example, the first interface 49 is aligned with the outline of the semiconductor layer 51. That is, the distance a is maintained at "0 (zero)". As a result, it was confirmed, as shown in FIG. 9, that a dark current is drastically reduced when the distance b is 2.5 μm or more, as compared with the case of the comparative example.

Figure 10:
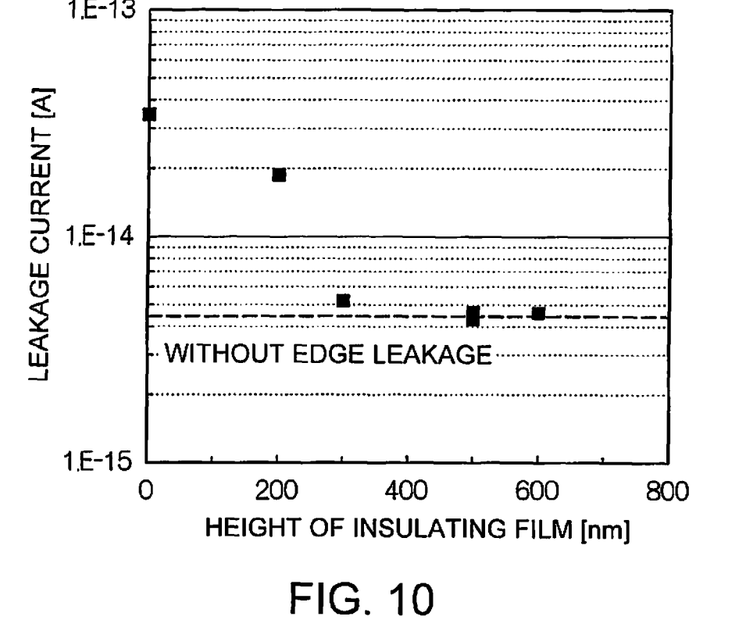
FIG. 10 is a graph showing the correlative relationship of the thickness of an insulating film on the lower electrode, to a dark current.

Then, the inventors examined the effect of the thickness of the insulating film 52. The inventors measured a dark current while varying the thickness of the insulating film 52. The distance a is maintained at 1.5 μm, and the distance b is maintained at 3.0 μm. As a result, it was confirmed, as shown in FIG. 10, that a dark current is suppressed when the thickness of the insulating film 52 is 300 nm or more.

4. Method for Manufacturing Photoelectric Conversion Device

Hereinafter, a method for manufacturing the photoelectric conversion device 11 will be described. Each photoelectric conversion device 11 is formed in a section on a substrate material. The substrate material is made from the same material as that of the substrate 31. The substrate material may be, for example, a glass substrate wafer or a silicon wafer. Each photoelectric conversion device 11 is cut out from the substrate material.

When the photoelectric conversion device 11 is manufactured, the TFT 21 is formed in each photodetection element 12 on the substrate material according to the existing formation method. When the TFT 21 is formed, the first interlayer insulating film 41 and the second interlayer insulating film 45 are stacked on the entire surface of the substrate material. When the second interlayer insulating film 45 is formed, the surface of the first interlayer insulating film 41 is planarized with an acrylic resin having the film thickness of about 3 μm, and a silicon nitride film having the thickness of about 200 nm is formed by a CVD (chemical vapor deposition) method. Then, for each photodetection element 12, the photodiode 22 is formed on the second interlayer insulating film 45 in association with the corresponding TFT 21.

Figure 11:
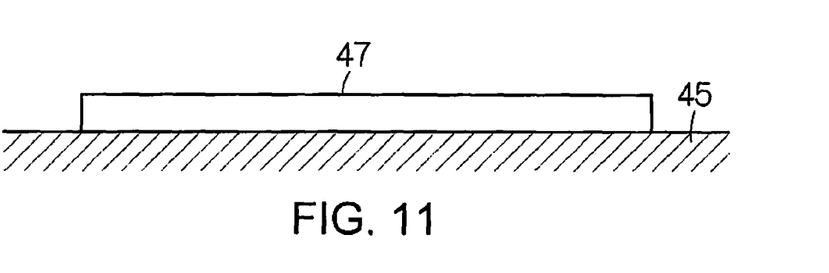
FIG. 11 is a diagram schematically showing a method for manufacturing a photoelectric conversion device, specifically a vertical cross-sectional view showing a lower electrode formed on a substrate.

Hereinafter, a method for forming the photodiode 22 will be described in detail. As shown in FIG. 11, the lower electrode 47 is first formed on the second interlayer insulating film 45. The photolithography technique, for example, may be used in the formation. The lower electrode 47 is made from a conducting film having a uniform thickness and patterned in a predetermined pattern. The conducting film may be, for example, an aluminum film. A uniform conducting film may be formed by, for example, a vapor deposition method or the like.

Figure 12:
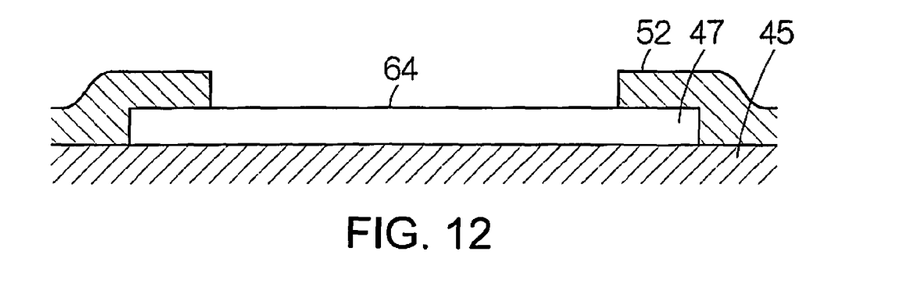
FIG. 12 is a diagram schematically showing a method for manufacturing a photoelectric conversion device, specifically a vertical cross-sectional view schematically showing processing for forming an insulating film.

As shown in FIG. 12, the insulating film 52 is stacked over the entire surface of the second interlayer insulating film 45. The insulating film 52 is formed by a silicon nitride film or a silicon dioxide film. A CVD method, for example, may be used in the stack formation. The insulating film 52 is formed on the lower electrode 47. The insulating film 52 is patterned in a predetermined pattern. According to the pattern, a target region 64 for the first interface 49 is defined on the lower electrode 47. The target region 64 is enclosed by the insulating film 52. The surface (upper surface) of the lower electrode 47 is exposed in the target region 64. Accordingly, the insulating film 52 overlaps the lower electrode 47, extending inward from the peripheral outline thereof.

Figure 13:
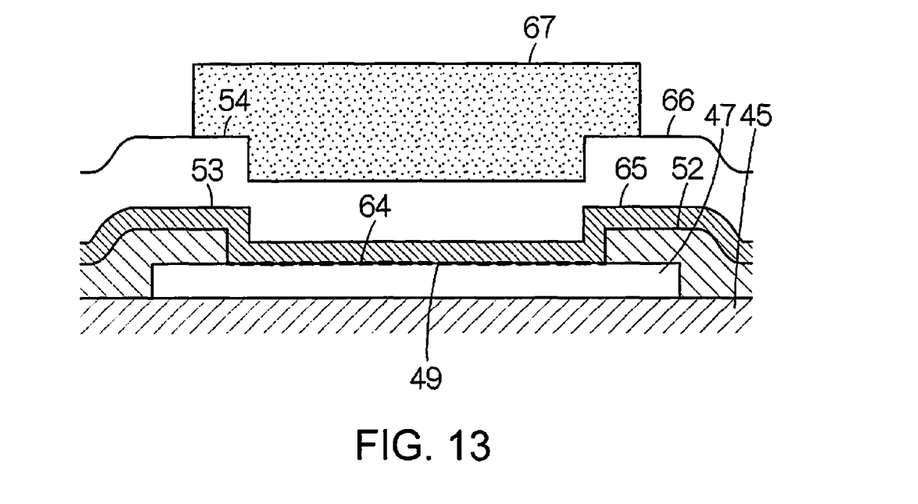
FIG. 13 is a diagram schematically showing a method for manufacturing a photoelectric conversion device, specifically a vertical cross-sectional view schematically showing processing for forming the lower contact layer and a semiconductor layer.

Then, the lower contact layer 48 and the semiconductor layer 51 are formed on the lower electrode 47. In the formation of the lower contact layer 48 and the semiconductor layer 51, as shown in FIG. 13, a raw material film 65 of the lower contact layer 48 and a raw material film 66 of the semiconductor layer 51 are formed uniformly over the entire surface of the second interlayer insulating film 45. The raw material film 65 is made from $N^+$ amorphous silicon, and the raw material film 66 is made from microcrystal silicon. The raw material films 65 and 66 may be formed successively by the CVD method. The raw material films 65 and 66 are stacked on the lower electrode 47 and the insulating film 52. The raw material films 65 and 66 overlap the target region 64 for the first interface 49. Since the raw material films 65 and 66 have a uniform thickness, the surfaces of the raw material films 65 and 66 reflect the shape of the surface of the insulating film 52. Accordingly, the raw material films 65 and 66 respectively have step-like surfaces 53 and 54 with respect to each photoelectric conversion device 11. A resist film 67 is formed on the raw material film 66. The resist film 67 has the shape of the semiconductor layer 51 and the lower contact layer 48. Based on the photolithography technique, the lower contact layer 48 and the semiconductor layer 51 are formed from the raw material films 65 and 66 and patterned in a predetermined pattern, using the resist film 67. With this, the lower contact layer 48 and the semiconductor layer 51 are formed. The insulating film 52 limits the lower contact layer 48 on the lower electrode 47. Thus, the first interface 49 is formed between the lower contact layer 48 and the lower electrode 47 as required. The lower contact layer 48 and the semiconductor layer 51 have their outlines outside the first interface 49 when seen in the plan view.

Figure 14:
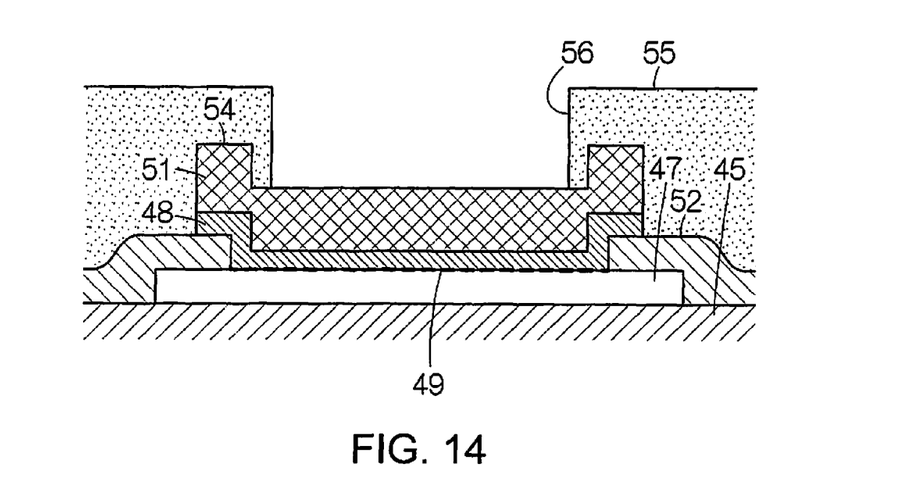
FIG. 14 is a diagram schematically showing a method for manufacturing a photoelectric conversion device, specifically a vertical cross-sectional view schematically showing processing for forming a third interlayer insulating film.

As shown in FIG. 14, the third interlayer insulating film 55 is formed over the entire surface of the second interlayer insulating film 45. The third interlayer insulating film 55 is formed by, for example, a silicon dioxide film or a silicon nitride film. A CVD method is used in the formation of the film. The insulating film 52, the semiconductor layer 51, and the lower contact layer 48 are buried into the third interlayer insulating film 55. The third interlayer insulating film 55 has an opening 56 on the semiconductor layer 51. Accordingly, the surface (top surface) of the semiconductor layer 51 is exposed inside the step-like surface 54.

Figure 15:
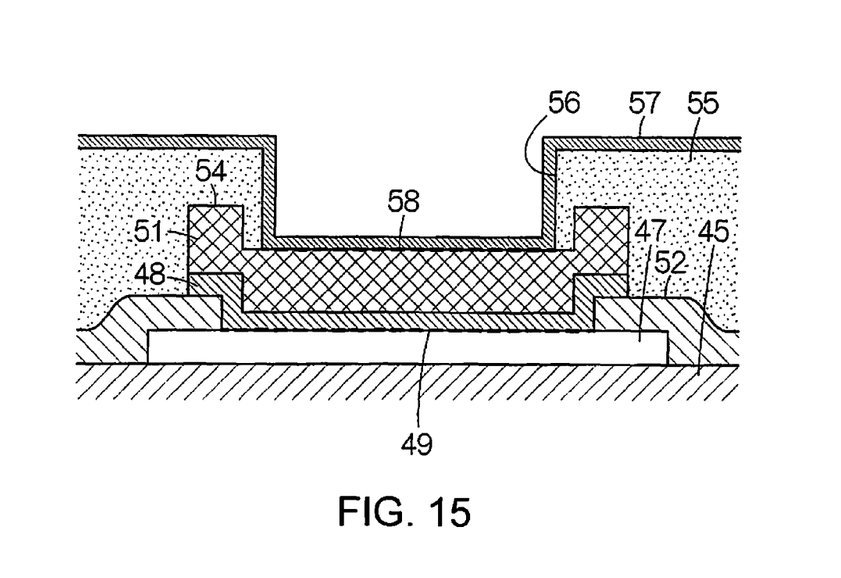
FIG. 15 is a diagram schematically showing a method for manufacturing a photoelectric conversion device, specifically a vertical cross-sectional view schematically showing processing for forming an upper contact layer.

As shown in FIG. 15, the upper contact layer 57 is formed on the third interlayer insulating film 55. The upper contact layer 57 is formed uniformly. The upper contact layer 57 is made from $P^+$ amorphous silicon. The upper contact layer 57 may be formed by a CVD method. In the opening 56, the upper contact layer 57 covers the exposed surface of the semiconductor layer 51. On the semiconductor layer 51, the upper contact layer 57 is limited by the third interlayer insulating film 55. Accordingly, the second interface 58 is formed between the semiconductor layer 51 and the upper contact layer 57. The second interface 58 has its outline within the outlines of the semiconductor layer 51 and the lower contact layer 48 when seen in the plan view.

Figure 16:
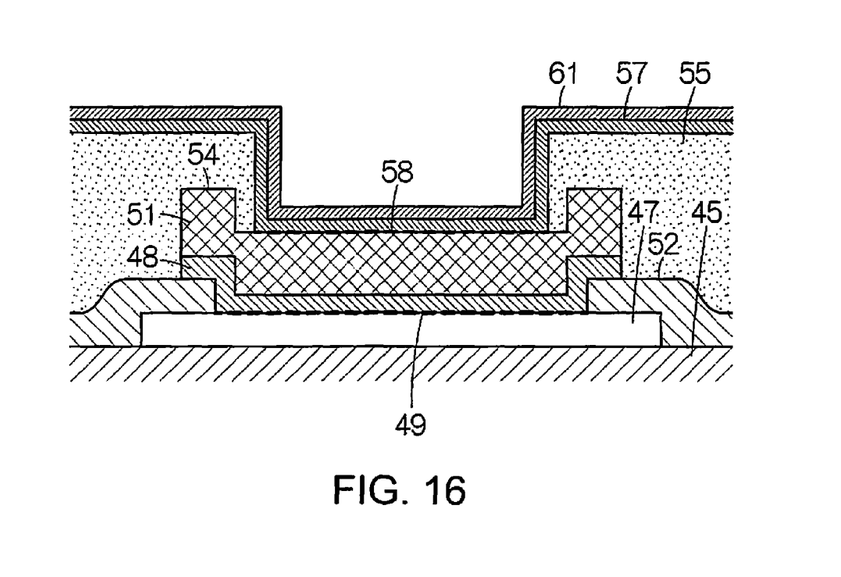
FIG. 16 is a diagram schematically showing a method for manufacturing a photoelectric conversion device, specifically a vertical cross-sectional view schematically showing processing for forming an upper electrode.

Then, as shown in FIG. 16, an upper electrode 61 is formed on the upper contact layer 57. The upper electrode 61 may be formed from a uniform conducting film and patterned. The conducting film may be an ITO film. In the patterning, the conducting film and the upper contact layer 57 are removed by etching processing. Before the upper electrode 61 and the upper contact layer 57 are patterned, the exposed surface of the semiconductor layer 51 is covered with the third interlayer insulating film 55 and the upper contact layer 57. The end face of the semiconductor layer 51 is protected by the third interlayer insulating film 55.

5. Structure of Photodetection Element According to Second Embodiment

Figure 17:
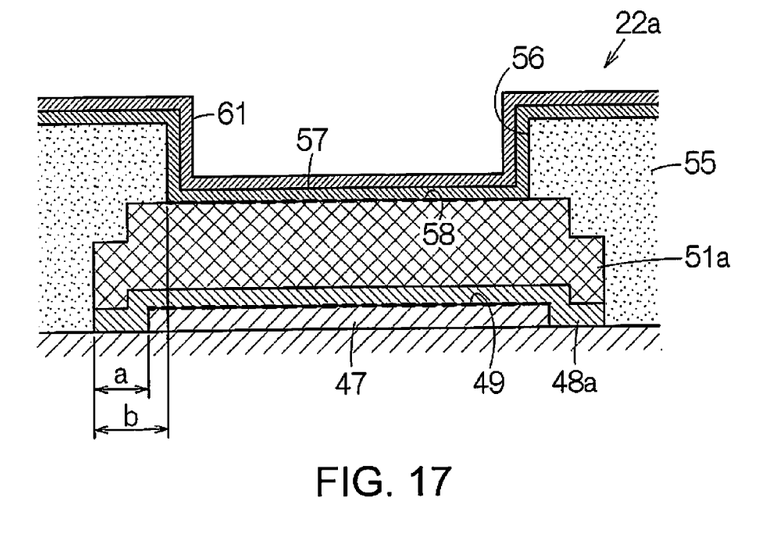
FIG. 17 is a vertical cross-sectional view schematically showing a configuration of a photodetection element according to a second embodiment.

FIG. 17 schematically shows a photodiode 22a of a photoelectric conversion device according to a second embodiment. In the photodiode 22a, a lower contact layer (first carrier holding layer) 48a is stacked on the lower electrode 47. The lower contact layer 48a extends outward beyond the outline of the lower electrode 47 when seen in the plan view. The outline of the semiconductor layer 51a is aligned with the outline of the lower contact layer 48a. The lower contact layer 48a is in contact with the lower electrode 47 via the first interface 49. The first interface 49 is arranged within the outlines of the lower contact layer 48a and the semiconductor layer 51a. Other configurations are the same as those of the above-described photodiode 22. In the photodiode 22a, as with the forgoing embodiment, a distance a between the end of the first interface 49 and the end faces of the lower contact layer 48a and the semiconductor layer 51a, and a distance b between the end of the second interface 58 and the end faces of the lower contact layer 48a and the semiconductor layer 51a have the relationship of b>a or the like. Therefore, the photodiode 22a can achieve the same functional effects as those of the above-described photodiode 22.

6. Structure of Photodetection Element According to Third Embodiment

Figure 18:
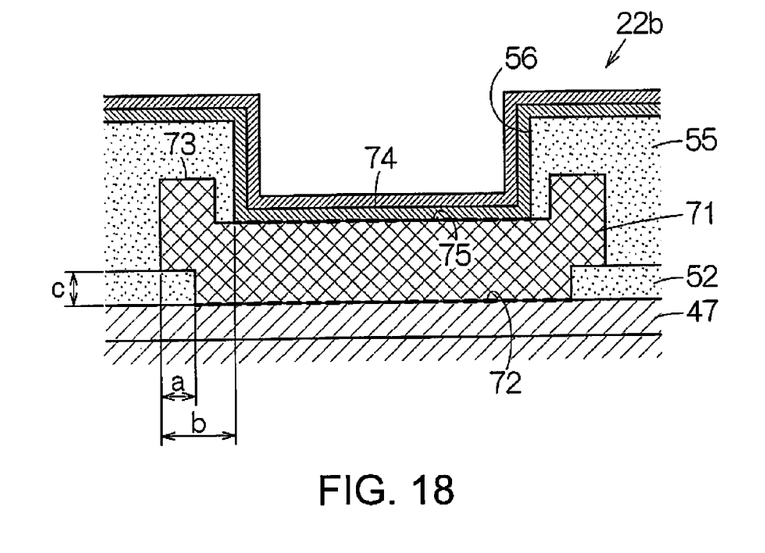
FIG. 18 is a vertical cross-sectional view schematically showing a configuration of a photodetection element according to a third embodiment.

FIG. 18 schematically shows a photodiode 22b of a photoelectric conversion device according to a third embodiment. In the photodiode 22b, a p-type semiconductor layer (first carrier holding layer) 71 is arranged on the lower electrode 47. Similarly to the above-described lower contact layer 48, the p-type semiconductor layer 71 is limited by the insulating film 52 on the lower electrode 47. Accordingly, the p-type semiconductor layer 71 is in contact with the lower electrode 47 via a first interface 72. The first interface 72 has its outline within the outline of the p-type semiconductor layer 71 when seen in the plan view. The part of the p-type semiconductor layer 71 that is outside the first interface 72 sits on the insulating film 52 on the lower electrode 47. Accordingly, the p-type semiconductor layer 71 has a step-like surface 73. A third interlayer insulating film 55 covers the p-type semiconductor layer 71. The p-type semiconductor layer 71 may be, for example, a light-absorbing layer made from chalcopyrite.

An n-type semiconductor layer (second carrier holding layer) 74 is arranged on the third interlayer insulating film 55. The n-type semiconductor layer 74 extends into the opening 56. In the opening 56, the n-type semiconductor layer 74 is stacked on the surface of the p-type semiconductor layer 71. Accordingly, the n-type semiconductor layer 74 defines a second interface 75 with the p-type semiconductor layer 71. The p-type semiconductor layer 71 forms a current conduction path between the second interface 75 and the first interface 72. The second interface 75 has its outline within the outline of the p-type semiconductor layer 71 when seen in the plan view. Other configurations are the same as those of the photodiode 22. In the photodiode 22b, as with the forgoing embodiment, a distance a between the end of the first interface 72 and the end face of the p-type semiconductor layer 71, and a distance b between the end of the second interface 75 and the end face of the p-type semiconductor layer 71 have the relationship of b>a or the like. The film thickness c of the insulating film 52 has the above-described relationship. Accordingly, the photodiode 22b can achieve the same functional effects as those of the above-described photodiode 22. Carrier movement is realized between the p-type semiconductor layer 71 and the n-type semiconductor layer 74. The semiconductor layers 51 and 51a may be omitted here, in contrast to the cases of the PIN structure photodiodes 22 and 22a.

7. Biometric Authentication Device Serving as Electronic Device

Figure 19:
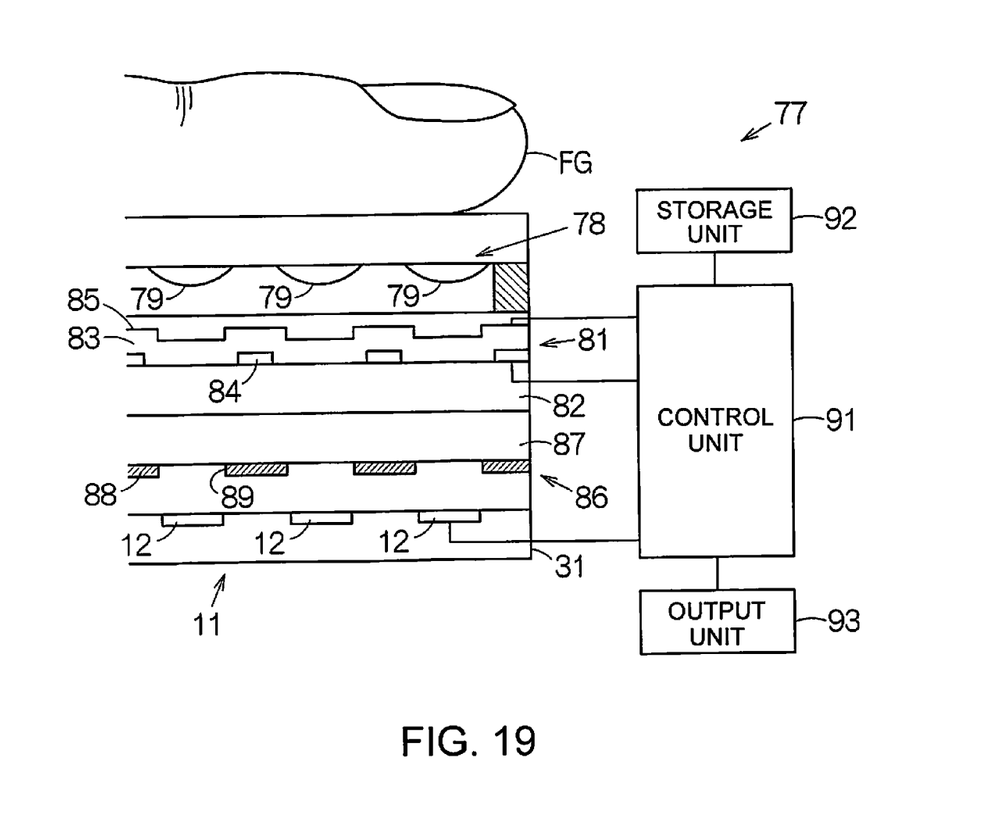
FIG. 19 is a conceptual diagram schematically showing a configuration of a biometric authentication device taken as a specific example of the electronic device.

As shown in FIG. 19, the photoelectric conversion device 11 may be used by being incorporated into a biometric authentication device 77. The biometric authentication device 77 includes a microlens array 78. The microlens array 78 is constituted by microlenses 79 that are arranged, for example, in a matrix. A light-emitting substrate 81 faces the microlens array 78. The light-emitting substrate 81 includes a light-emitting layer 83 formed on the surface of a substrate body 82. The light-emitting layer 83 is made from, for example, an organic EL (electroluminescence) material. The light-emitting layer 83 is sandwiched between a first electrode layer 84 and a second electrode layer 85. When a voltage is applied to the light-emitting layer 83 from the first electrode layer 84 and the second electrode layer 85, the light-emitting layer 83 emits light in a direction orthogonal to the light-emitting layer 83.

The light-emitting substrate 81 is overlaid over a light-blocking substrate 86. The light-blocking substrate 86 includes a light-blocking layer 88 that is formed on the rear surface of a substrate body 87. The light-blocking layer 88 is made from, for example, a light-blocking material such as a metallic film, e.g., a chromium film, or an opaque resin film. Openings 89 that correspond to the light paths of the microlenses 79 are formed in the light-blocking layer 88. The light-blocking substrate 86 is overlaid on the photoelectric conversion device 11. Rays of light collected by the microlenses 79 are received by the respective photodetection elements 12.

A control unit 91 is connected to the light-emitting substrate 81 and the photoelectric conversion device 11. The control unit 91 controls light emission of the light-emitting layer 83 and processes output signals of the photodetection elements 12. When controlling light emission, the control unit 91 controls voltage supply to the first electrode layer 84 and the second electrode layer 85 of the light-emitting substrate 81, for example. A finger FG is irradiated with light from the light-emitting layer 83. The light is near infrared rays and has a wavelength of, for example, 750 to 3000 nm (preferably 800 to 900 nm). The light, when having arrived at the inside of the finger FG, is scattered and part thereof, serving as reflected light, is directed to the photodetection elements 12. Each photodetection element 12 outputs an electric signal that depends on the intensity of the near infrared rays. An image of the light is formed according to the outputs of the photodetection elements 12 arranged in an array. Since hemoglobin in veins absorbs light of near infrared rays, a dark vein image can be formed in the image. The control unit 91 may employ an arithmetic processing circuit such as a microprocessor unit (MPU).

A storage unit 92 and an output unit 93 are connected to the control unit 91. A vein image is stored in the storage unit 92 under a predetermined identifier. The vein image is obtained by the photoelectric conversion device 11 and registered. Every person has a different vein image. The storage unit 92 may be, for example, a nonvolatile memory such as a flash memory or a hard disk drive. When performing biometric authentication, the control unit 91 checks the captured vein image against the registered vein image. If the captured vein image matches the registered vein image, authentication of the person is accomplished. An output signal indicating completion of authentication is output by the output unit 93. If the captured vein image does not match the registered vein image, authentication of the person is denied. An output signal indicating failure of authentication is output by the output unit 93. This biometric authentication device 77 may be used, for example, in an entrance and exit control device or an automated teller machine (ATM), or for user management for a mobile phone, a smartphone, or the like.

Note that, although the embodiments have been explained in detail above, a person skilled in the art will readily appreciate that it is possible to implement numerous modifications that do not depart substantially from the novel aspects and effect of the invention. Accordingly, all such modifications are also to be included within the scope of the invention. For example, terms that are used within the description or drawings at least once together with broader terms or alternative synonymous terms can be replaced by those other terms at other locations as well within the description or drawings. Also, the configuration and operation of the photoelectric conversion device 11, the photodetection element 12, the switching element, the photoelectric conversion element, the biometric authentication device 77, the electronic device, and the like are not limited to those described in the embodiments, and various modifications are possible.

What is claimed is:

1. A semiconductor device comprising:
    a lower electrode arranged on a substrate;
    a first carrier holding layer arranged on and contacting the lower electrode to define a first interface therebetween, and including a plurality of majority carriers of a first type;
    a semiconductor layer arranged on the first carrier holding layer; and
    a second carrier holding layer arranged on and contacting the semiconductor layer to define a second interface therebetween with a conduction path being defined by the semiconductor layer and the first carrier holding layer between the first and second interfaces, and including a plurality of majority carriers of a second type,
    the first interface having an outline thereof within an outline of the first carrier holding layer when seen in a plan view in a direction that is orthogonal to a surface of the substrate on which the lower electrode is disposed,
    the second interface having an outline thereof within the outline of the first carrier holding layer when seen in the plan view, and
    at least a part of the first interface overlaps a part of the second interface when seen in the plan view.

2. The semiconductor device according to claim 1, wherein a distance a between an end of the first interface and an end of the first carrier holding layer, and a distance b between an end of the second interface and the end of the first carrier holding layer have a relationship of b>a.

3. The semiconductor device according to claim 2,
wherein a difference between the distance b and the distance a is greater than 1 µm and less than 3 µm.

4. The semiconductor device according to claim 1, further comprising
an insulating film that overlaps a part of the lower electrode that is outside the first interface along the outline of the first interface, and supports, on the lower electrode, a part of the first carrier holding layer.

5. The semiconductor device according to claim 4,
wherein the insulating film has a thickness of 300 nm or more, measured from the surface of the lower electrode.

6. The semiconductor device according to claim 1,
wherein the first carrier holding layer has a length of from 5 µm or more to 20 µm or less, measured along the surface of the lower electrode.

7. The semiconductor device according to claim 1,
wherein the second interface is defined between the first carrier holding layer and the second carrier holding layer.

8. A photoelectric conversion device comprising the semiconductor device according to claim 1.

9. An electronic device comprising the semiconductor device according to claim 1.

\* \* \* \* \*